(12) United States Patent
Pendse

(10) Patent No.: US 9,385,074 B2
(45) Date of Patent: *Jul. 5, 2016

(54) SEMICONDUCTOR PACKAGE WITH EMBEDDED DIE

(71) Applicant: STATS ChipPAC, Ltd., Singapore (SG)

(72) Inventor: Rajendra D. Pendse, Fremont, CA (US)

(73) Assignee: STATS ChipPAC Pte. Ltd., Singapore (SG)

( * ) Notice: Subject to any disclaimer, the term of this patent is extended or adjusted under 35 U.S.C. 154(b) by 3 days.

This patent is subject to a terminal disclaimer.

(21) Appl. No.: 13/935,053

(22) Filed: Jul. 3, 2013

(65) Prior Publication Data

US 2013/0292829 A1 Nov. 7, 2013

Related U.S. Application Data

(60) Continuation of application No. 13/441,691, filed on Apr. 6, 2012, now Pat. No. 8,525,337, which is a division of application No. 11/595,638, filed on Nov. 10, 2006, now Pat. No. 8,174,119.

(51) Int. Cl.
*H01L 23/498* (2006.01)
*H01L 23/31* (2006.01)
(Continued)

(52) U.S. Cl.
CPC .......... *H01L 23/49811* (2013.01); *H01L 21/56* (2013.01); *H01L 23/3121* (2013.01); *H01L 24/24* (2013.01); *H01L 24/82* (2013.01); *H01L 25/105* (2013.01); *H01L 2224/24051* (2013.01); *H01L 2224/24226* (2013.01); *H01L 2225/1035* (2013.01); *H01L 2924/014* (2013.01); *H01L 2924/01005* (2013.01); *H01L 2924/01006* (2013.01); *H01L 2924/01012* (2013.01); *H01L 2924/01013* (2013.01); *H01L 2924/01029* (2013.01); *H01L 2924/01033* (2013.01); *H01L 2924/01042* (2013.01); *H01L 2924/01074* (2013.01); *H01L 2924/01075* (2013.01); *H01L 2924/01079* (2013.01); *H01L 2924/12042* (2013.01); *H01L 2924/14* (2013.01); *H01L 2924/1433* (2013.01); *H01L 2924/1461* (2013.01); *H01L 2924/19041* (2013.01)

(58) Field of Classification Search
CPC ....... H01L 24/12; H01L 24/11; H01L 21/563; H01L 23/49811; H01L 23/3121; H01L 24/82
USPC .......... 257/738, 686, 706, 734–737; 438/617
See application file for complete search history.

(56) References Cited

U.S. PATENT DOCUMENTS 4,681,795 A 7/1987 Tuckerman
5,250,843 A 10/1993 Eichelberger
(Continued)

OTHER PUBLICATIONS

Riley, George A. "Stud Bump Flip Chip" FlipChips Dot Com, Dec. 2000, Tutorial 3.

*Primary Examiner* — Nathan Ha
(74) *Attorney, Agent, or Firm* — Robert D. Atkins; Patent Law Group: Atkins and Associates, P.C.

(57) ABSTRACT

A semiconductor package having an embedded die and solid vertical interconnections, such as stud bump interconnections, for increased integration in the direction of the z-axis (i.e., in a direction normal to the circuit side of the die). The semiconductor package can include a die mounted in a face-up configuration (similar to a wire bond package) or in a face-down or flip chip configuration.

26 Claims, 3 Drawing Sheets

(51) Int. Cl.
*H01L 23/00* (2006.01)
*H01L 25/10* (2006.01)
*H01L 21/56* (2006.01)

(56) References Cited

U.S. PATENT DOCUMENTS

| | | | |
|---|---|---|---|
| 5,353,498 A | 10/1994 | Fillion et al. | |
| 5,381,039 A | 1/1995 | Morrison | |
| 5,528,462 A | 6/1996 | Pendse | |
| 5,764,486 A | 6/1998 | Pendse | |
| 5,768,776 A | 6/1998 | Pendse | |
| 5,818,114 A | 10/1998 | Pendse et al. | |
| 5,841,193 A | 11/1998 | Eichelberger | |
| 5,874,780 A | 2/1999 | Murakami | |
| 5,920,200 A | 7/1999 | Pendse et al. | |
| 5,987,744 A | 11/1999 | Lan et al. | |
| 6,059,894 A | 5/2000 | Pendse | |
| 6,159,420 A | 12/2000 | Akimoto | |
| 6,259,163 B1* | 7/2001 | Ohuchi | H01L 21/4853 257/738 |
| 6,417,573 B1 | 7/2002 | Pendse | |
| 6,737,295 B2 | 5/2004 | Pendse et al. | |
| 6,780,682 B2 | 8/2004 | Pendse | |
| 6,784,530 B2 | 8/2004 | Sugaya et al. | |
| 6,815,252 B2 | 11/2004 | Pendse | |
| 6,815,254 B2 | 11/2004 | Mistry et al. | |
| 6,828,220 B2 | 12/2004 | Pendse | |
| 6,940,178 B2 | 9/2005 | Kweon et al. | |
| 6,995,041 B2 | 2/2006 | Connell et al. | |
| 7,011,988 B2 | 3/2006 | Forcier | |
| 7,033,859 B2 | 4/2006 | Pendse | |
| 7,034,391 B2 | 4/2006 | Pendse | |
| 7,057,269 B2 | 6/2006 | Karnezos | |
| 7,446,419 B1 | 11/2008 | Lin et al. | |
| 7,619,901 B2 | 11/2009 | Eichelberger et al. | |
| 7,713,782 B2* | 5/2010 | Pendse | H01L 24/03 257/E21.514 |
| 8,193,035 B2* | 6/2012 | Pendse | H01L 24/03 257/E21.519 |
| 8,778,738 B1* | 7/2014 | Lin | H01L 23/49827 257/738 |
| 2001/0038151 A1 | 11/2001 | Takahashi et al. | |
| 2003/0071352 A1* | 4/2003 | Ohuchi | H01L 21/76885 257/737 |
| 2003/0151140 A1* | 8/2003 | Nishiyama | H01L 21/563 257/737 |
| 2003/0189248 A1* | 10/2003 | Estacio | H01L 23/4824 257/737 |
| 2004/0113272 A1* | 6/2004 | Chen | H01L 24/03 257/737 |
| 2004/0126927 A1* | 7/2004 | Lin et al. | 438/107 |
| 2004/0145044 A1 | 7/2004 | Sugaya et al. | |
| 2004/0178499 A1* | 9/2004 | Mistry | H01L 21/56 257/734 |
| 2004/0262774 A1 | 12/2004 | Kang et al. | |
| 2005/0003578 A1 | 1/2005 | Wu | |
| 2005/0006739 A1* | 1/2005 | Howard | H01L 23/13 257/678 |
| 2005/0077632 A1 | 4/2005 | Hedler et al. | |
| 2005/0109455 A1 | 5/2005 | Bai | |
| 2005/0161804 A1 | 7/2005 | Iijima et al. | |
| 2005/0230848 A1 | 10/2005 | Nakatani et al. | |
| 2005/0275096 A1* | 12/2005 | Zeng | B23K 35/262 257/737 |
| 2006/0055032 A1* | 3/2006 | Chang | H01L 21/4853 257/734 |
| 2006/0216868 A1 | 9/2006 | Yang et al. | |
| 2006/0244157 A1 | 11/2006 | Carson | |
| 2006/0267157 A1* | 11/2006 | Edwards | H01L 21/4846 257/646 |
| 2007/0108583 A1 | 5/2007 | Shim et al. | |
| 2008/0023830 A1 | 1/2008 | Chang et al. | |
| 2008/0111233 A1 | 5/2008 | Pendse | |
| 2008/0136035 A1 | 6/2008 | Aggarwal et al. | |
| 2008/0296759 A1 | 12/2008 | Ramakrishna et al. | |
| 2009/0014859 A1 | 1/2009 | Jeung et al. | |
| 2009/0170241 A1 | 7/2009 | Shim et al. | |
| 2009/0236686 A1 | 9/2009 | Shim et al. | |

* cited by examiner

SEMICONDUCTOR PACKAGE WITH EMBEDDED DIE

CLAIM OF DOMESTIC PRIORITY

The present application is a continuation of U.S. patent application Ser. No. 13/441,691, now U.S. Pat. No. 8,525,337, filed Apr. 6, 2012, which is a division of U.S. patent application Ser. No. 11/595,638, now U.S. Pat. No. 8,174,119, filed Nov. 10, 2006, which applications are incorporated herein by reference.

FIELD OF THE INVENTION

The present disclosure relates to semiconductor packing.

BACKGROUND OF THE INVENTION

Electronic products such as mobile phones, computers, and various consumer products require higher semiconductor functionality and performance in a limited footprint and minimal thickness and weight at the lowest cost. This has driven the industry to increase integration on the individual semiconductor chips.

Conventional chip packing technologies have two inherent limitations: (1) the input/output emerges from only one side of the package (i.e., either from the top or bottom side of the package), and hence integration in both directions along the "z-axis" is difficult, and (2) the footprint of the package is either equal to the die size for fan-in configurations (e.g., WLCSP) or significantly greater than the die size for fan-out configurations.

A recent technique for integrating along the z-axis involves encapsulating a die on a substrate, drilling holes through the encapsulating layer around the periphery of the die, filling the holes with a metal to form vertical connections extending from the PC board, and forming a circuitry layer over the encapsulating layer to permit mounting of a component over the die. This technique suffers from at least the following disadvantages. First, using conventional laser drilling or other known techniques for forming the holes in the encapsulating layer, the pitch between vertical connections is limited to about 125 microns. Second, the drilling process typically results in height variations among the vertical connections, which can produce traces of the circuitry layer that are non-coplanar. Because of this irregularity, a component mounted on top of the circuitry layer may fail to establish sufficient physical and electrical contact with the traces, resulting in a nonfunctioning package. Third, the traces in the circuitry layer typically are flared or enlarged to capture the upper ends of the vertical connections, thereby decreasing the density of the traces. Fourth, the holes in the encapsulating layer must be plated several times in order to form solid vertical interconnections.

Accordingly, there remains room for improvement within the field of semiconductor packaging.

SUMMARY OF THE INVENTION

According to one aspect, the present disclosure concerns embodiments of a semiconductor package employing stud bump interconnections for increased integration in the direction of the z-axis (i.e., in a direction normal to the circuit side of the die). The semiconductor package can include a die mounted in a face-up configuration (similar to a wire bond package) or in a face-down or flip chip configuration.

The semiconductor package includes stud bumps formed on the substrate around the periphery of the die. The package also can include an encapsulating layer of a dielectric material at least partially encapsulating the die and the stud bumps and a circuitry layer formed over the encapsulating layer. The stud bumps contact respective traces or contacts of the circuitry layer, thereby establishing respective electrical connections between the substrate and the circuitry layer. The package can include one or more dies and/or any of various active or passive components mounted on the circuitry layer and electrically connected to the substrate via the stud bumps. The side of the substrate opposite the die can be mounted to a motherboard or other components, allowing for integration of the package in either direction along the z-axis.

Where the semiconductor package includes a die mounted to a substrate in a face-up orientation, the circuit side of the die can include stud bumps forming vertical interconnections between the die and respective traces of the circuitry layer. The traces also are in contact with respective substrate-level stud bumps, thereby establishing electrical connections between the circuit side of the die and the substrate, without the need for wire bonds. Where the semiconductor package includes a flip chip die, the circuit side of the die can be mounted to the substrate in a conventional manner, such as with a plurality of bumps bonded to pads on the circuit side of the die and the substrate. In the flip chip package, only substrate-level stud bumps need be provided.

Prior to forming the circuitry layer, the upper surfaces of the stud bumps can be planarized so that the contact sites of the circuitry layer are substantially coplanar and therefore can form robust connections with bumps or other contacts of the component(s) mounted on the circuitry layer. Another advantage of employing stud bumps for die-level and substrate-level interconnections is that a relatively fine pitch can be achieved. In particular embodiments, the pitch of the substrate-level stud bumps can be about 80 microns or less, and more desirably about 60 microns or less. The pitch of the die-level stud bumps in particular embodiments can be about 50 microns or less, and more desirably about 30 microns or less. The pitch of stud bumps enables extreme miniaturization of the overall package size. In particular embodiments, for example, the package can have a horizontal footprint (i.e., a footprint in an x-y plane parallel to the major surfaces of the substrate) that is no greater than the horizontal footprint of the die plus about 0.5 mm in the x and y directions, and a height or thickness in the z-direction (excluding the substrate) that is no greater than the height or thickness of the die plus about 0.09 mm.

According to another aspect, the semiconductor package includes a die mounted in a face-up orientation on a support layer, an encapsulating layer formed over the die, a circuitry layer formed over the encapsulating layer, a plurality of stud bumps forming vertical interconnections between the circuit side of the die and the circuitry layer. The support layer can comprise a removable substrate that is removed from the die after the package is formed. Alternatively, the support layer can comprise a heat spreader that absorbs heat generated by the die and dissipates the heat to atmosphere or the motherboard on which the package is mounted.

In one representative embodiment, a semiconductor package comprises a substrate having first and second, opposed major surfaces, a die mounted to the first major surface of the substrate, a dielectric layer formed on the first major surface and at least partially encapsulating the die, a patterned metal layer formed over the dielectric layer, and a plurality of stud bumps interconnecting locations on the first major surface of the substrate with respective locations on the patterned metal layer.

In another representative embodiment, a semiconductor package comprises a substrate having first and second, opposed major surfaces, the first major surface having a plurality of pads. The package further comprises a die carried by the first major surface of the substrate, an encapsulating layer at least partially encapsulating the die, a circuitry layer formed over the encapsulating layer, and a plurality of metal interconnects, each extending between and establishing electrical contact with the circuitry layer and a respective pad on the first major surface of the substrate, wherein the metal interconnects have a pitch of about 80 microns or less.

In another representative embodiment, a semiconductor package comprises a substrate having first and second, opposed major surfaces, the first major surface having a plurality of pads. The package further comprises a die having a circuit side and a back side, the die being carried by the first major surface of the substrate with the back side facing the substrate, a plurality of substrate-level metal interconnects extending from the first major surface of the substrate, a plurality of die-level metal interconnects extending from the circuit side of the die, and a dielectric layer formed over the substrate-level and die-level metal interconnects. A circuitry layer is formed over the dielectric layer, the circuitry layer comprising a plurality of metal traces, at least some of the metal traces electrically connecting die-level metal interconnects with respective substrate-level metal interconnects.

In still another representative embodiment, a semiconductor package comprises a support layer, a die having a circuit side and a back side, the die being carried by support layer with the back side facing the support layer, a plurality of stud bumps disposed on the circuit side of the die, a dielectric layer formed over the circuit side of the die, and a circuitry layer formed over the dielectric layer and comprising a plurality of traces contacting the stud bumps.

In yet another representative embodiment, a method of making a semiconductor package comprises mounting a die on a surface of a substrate, forming a plurality of stud bumps on the surface of the substrate, forming a dielectric layer of dielectric material over the stud bumps and the die so as to at least partially encapsulate the stud bumps and the die, and forming a metal circuitry layer over the dielectric layer such that portions of the circuitry layer contact end surfaces of the stud bumps, the stud bumps thereby establishing electrical contact between the substrate and the circuitry layer.

In another representative embodiment, a method of making a semiconductor package comprises mounting a die in a face-up orientation on a support layer, forming a plurality of stud bumps on a circuit side of the die, forming a dielectric layer over the circuit side of the die, and forming a circuitry layer over the dielectric layer, the circuitry layer having a plurality of traces contacting the stud bumps.

The foregoing and other objects, features, and advantages of the invention will become more apparent from the following detailed description, which proceeds with reference to the accompanying figures.

DETAILED DESCRIPTION OF THE DRAWINGS

As used herein, the singular forms "a," "an," and "the" refer to one or more than one, unless the context clearly dictates otherwise.

As used herein, the term "includes" means "comprises." For example, a device that includes or comprises A and B contains A and B but may optionally contain C or other components other than A and B. A device that includes or comprises A or B may contain A or B or A and B, and optionally one or more other components such as C.

According to one aspect, the present disclosure concerns embodiments of a semiconductor package employing stud bump interconnections for increased integration in the direction of the z-axis. The semiconductor package can include a die mounted in a face-up configuration (similar to a wire bond package) or in a face-down or flip chip configuration.

Figure 1:
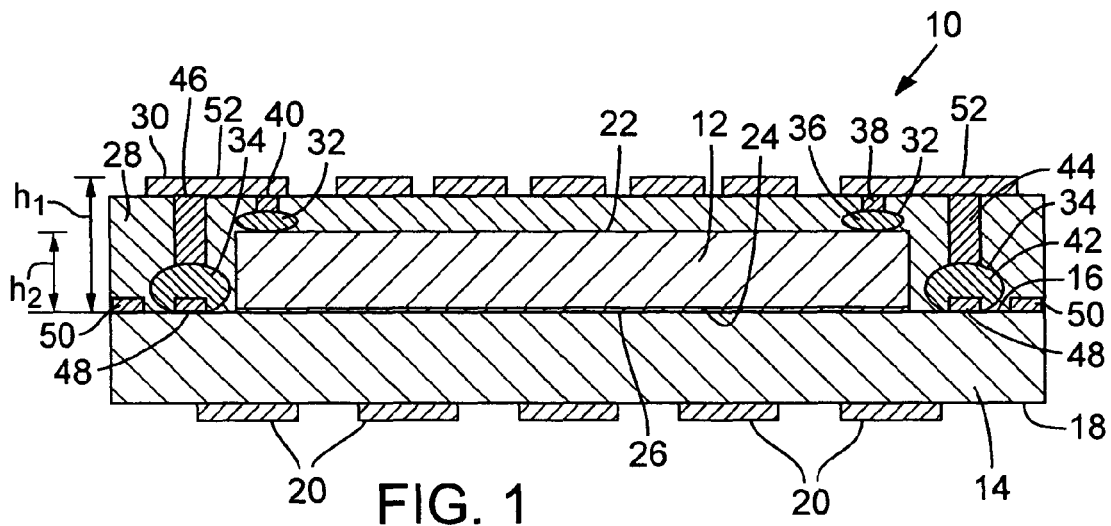
FIG. 1 is a schematic sectional view of a semiconductor package including a die mounted in a face-up orientation, according to one embodiment.

FIG. 1 shows an exemplary embodiment of semiconductor package 10 including at least one die 12 positioned in a face-up configuration on a substrate 14. The die 12 can comprise a conventional semiconductor die having any desired configuration. For example, the die 12 can comprise a dynamic random access memory (DRAM), a static random access memory (SRAM), a flash memory, a microprocessor, a digital signal processor (DSP) or an application specific integrated circuit (ASIC). The die 12, the substrate 14, and the overall package 10 can have any polygonal shape. In the illustrative embodiment, the die 12, the substrate 14 and the package 10 are rectangular in shape, but other polygonal shapes, such as square or hexagonal can also be utilized.

The substrate 14 has a first, or "upper", major surface 16 and an opposed second, or "lower" major surface 18. The terms "upper" and "lower" are used herein for purposes of description; the package need not have any particular orientation in use. The substrate 14 of package 10 (and the substrates of other embodiments disclosed herein) can comprise any type of substrate such as, for example, a laminate with plural metal layers, a build-up substrate with plural metal layers, a flexible polyimide tape with plural metal layers, and or a ceramic multilayer substrate. The second major surface 18 can include a plurality of contacts, or pads, 20. Respective solder balls (not shown) can be reflowed on the pads 20 using conventional techniques to provide interconnection to the circuitry of, for example, a motherboard (not shown) of a final product, such as a computer. Alternatively, other components can mounted to the second major surface 18 of the substrate, such as another die or multiple dies or any of various active or passive components.

The die 12 has a circuit side 22 and a back side 24 mounted on the first major surface 16 of the substrate 14. An adhesive layer 26 comprising for example, die attach epoxy, can be used to secure the back side 24 to the first major surface 16 of the substrate. An encapsulating layer 28, preferably made of a dielectric material, is formed over the die 12 and the first major surface 16 of the substrate so as to at least partially encapsulate the die 12. As shown in FIG. 1, in the illustrated embodiment, the encapsulating layer 28 completely encapsulates the die 12 and covers the area of the first major surface 16 surrounding the die 12.

Figure 2:
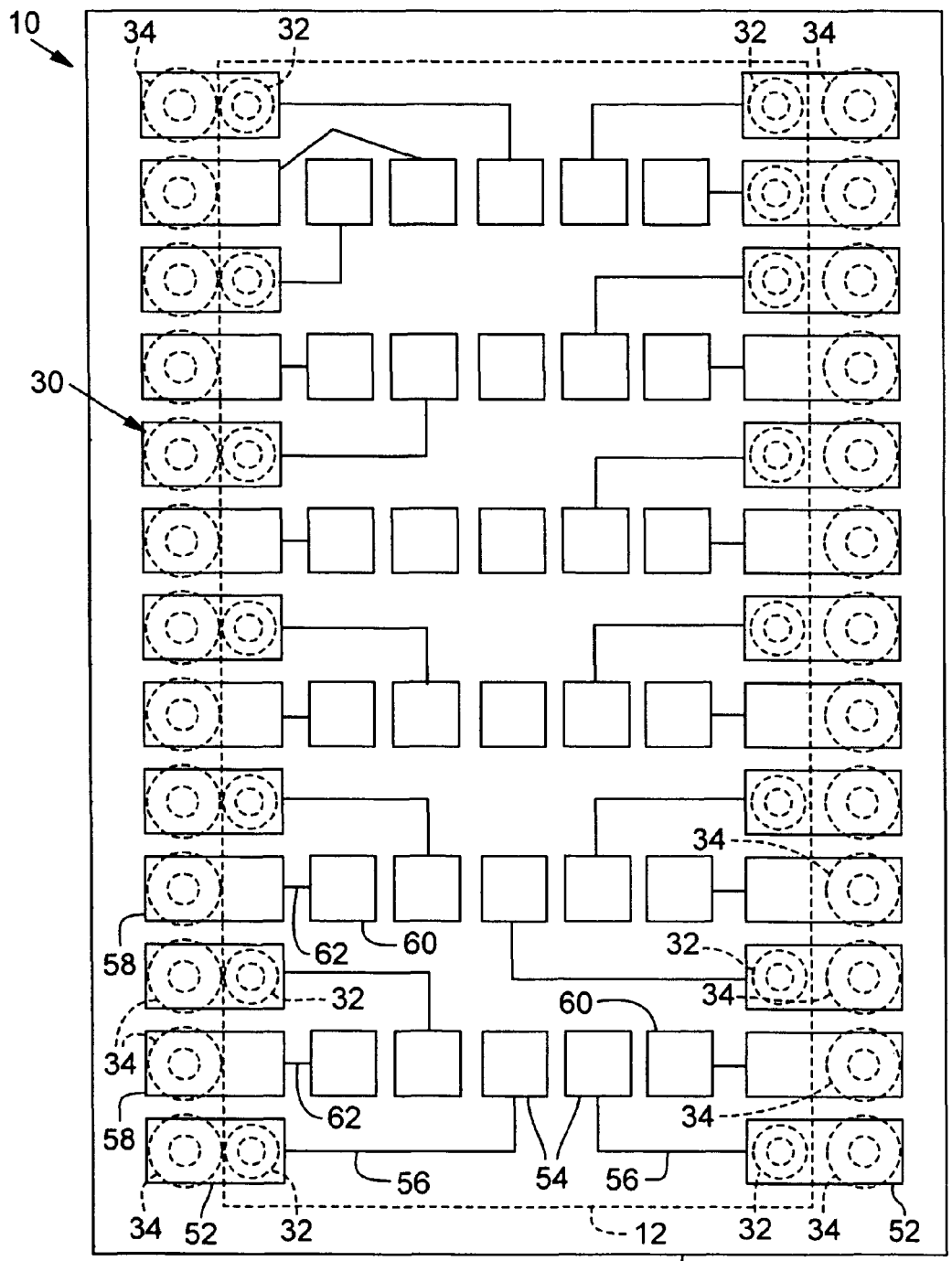
FIG. 2 is a schematic top plan view of the semiconductor package shown in FIG. 1.

In a conventional package having a die in a face-up orientation, the circuit side 22 is electrically connected to the substrate with wires bonded to pads on the die circuit side 22 and respective pads on the upper surface of the substrate. In the illustrated configuration, the die circuit side 22 can be electrically connected to the substrate 14 via a plurality of die-level stud bumps 32 and a plurality of substrate-level stud bumps 34 formed around the periphery of the die 12. A patterned metal layer forming a circuitry layer 30 is formed on top of the encapsulating layer 28 and includes metal traces that form electrical connections between stud bumps 32 and respective stud bumps 34 so as to electrically connect the die circuit side 22 to the first major surface 16 of the substrate 14. For example, as shown in FIGS. 1 and 2, each substrate-level stud bump 34 can be electrically connected to a respective die-level stud bump 32 by a respective trace 52. As shown in FIG. 2, each trace 52 can be electrically connected to a contact 54 by a trace 56 for connection to one or more components (not shown) mounted on the circuitry layer 30.

In alternative embodiments, a combination of wire bonds between the die circuit side 22 and the substrate 14 and electrical connections between stud bumps 32 and stud bumps 34 can be used to electrically connect the die to the substrate. Although less desirable, in still alternative embodiments, only wire bonds are used to form electrical connections between the die and the substrate.

The package 10 can also include substrate-level stud bumps 34 that function to electrically connect locations on the first major surface 16 of the substrate 14 to one or more components (not shown) on the circuitry layer 30. In this regard, the circuitry layer 30 can include contacts or traces forming electrical connections between stud bumps 34 and the circuitry of a component mounted on the circuitry layer. For example, as shown in FIG. 2, the circuitry layer 30 can include traces 58 in contact with the stud bumps 34. Traces 58 can be electrically connected to respective contacts 60 by respective traces 62 in the circuitry layer 30. One or more additional components can be mounted on the circuitry layer 30, for example, by reflowing solder balls (not shown) on selected one or more of the contacts 54, 60.

Conventional metal plated vias (not shown) can be provided in the substrate 14 to electrically connect pads 20 on the second major surface 18 of the substrate 14 with conductive pads 48, 50 on the first major surface 16 of the substrate 14.

The package can include one or more dies and/or any of various active or passive components mounted on the circuitry layer 30. Examples of active or passive components can include, without limitation, capacitors, microelectromechanical machines (MEMs), nanoelectromechanical machines, bioelectromechanical machines (BioMEMs), sensors, planar capacitors, resistors, planar resistors, inductors, fuel cells, antennas, thin film batteries, VCSEL's, and photodiodes. As mentioned above, such components also can be mounted to the second major surface 18 of the substrate, allowing for integration of the package in either direction along the z-axis.

Advantageously, the upper surfaces of the stud bumps 32, 34 can be planarized during the manufacturing process so that the contact sites of the circuitry layer 30 are substantially coplanar and therefore can form robust connections with bumps or other contacts of the component(s) mounted on the circuitry layer. In addition, the stud bumps 32, 34 can be easily formed while also providing solid vertical interconnections (without internal cavities or through holes) to ensure robust electrical connections between the die, substrate and other components mounted on the package. In contrast, where vertical interconnections are formed by filling holes in a dielectric layer (as described above in the Background of this disclosure), the holes must be plated several times to form solid interconnections, which increases the cost and time of manufacturing process.

As can be appreciated, the disclosed package allows for unlimited integration in the direction of the z-axis on either side of the package. The size of the horizontal footprint in the x and y directions can be adjusted to any desired size based on the input/output density of the die, using a combination of fan-in and fan-out routing.

Each of the stud bumps 32 in the illustrated embodiment has an enlarged base portion 36 and a relatively narrow upper stem portion 38 with the base portion 36 being affixed to a conductive pad (not shown) on the die circuit side 22 and the stem portion contacting a conductive trace of the circuitry layer 30. The stem portion 38 of each stud bump 32 desirably has a transverse planar top surface 40 that contacts a trace 52 of the circuitry layer 30. Similarly, each of the stud bumps 34 in the illustrated embodiment has an enlarged base portion 42 and a relatively narrow upper stem portion 44 with the base portion 42 being affixed to a conductive pad 48 on the first major surface 16 of the substrate and the stem portion 44 contacting a conductive trace or contact of the circuitry layer 30. The stem portion 44 of each stud bump 34 desirably has a transverse planar top surface 46 that contacts a trace of the circuitry layer 30 (e.g., a trace 52 or 58). The encapsulating layer 28 and the stud bumps 32, 34 can be planarized using conventional techniques prior to forming the circuitry layer to form the planar top surfaces 40, 46 of the stud bumps, as further described below. In other embodiments, the stud bumps 32, 34 can have various other shapes or configurations.

As shown, the stem portion of each stud bump 32, 34 in particular embodiments, has a transverse cross-sectional profile (taken along an x-y plane parallel to the sides 22, 24 of the die) that is less than that of the respective base portion. The stem portion of each stud bump 32, 34 in the illustrated embodiment is shown as having a generally cylindrical cross-sectional profile. Alternatively, the stem portion of each stud bump 32, 34 can be formed as a truncated cone that tapers slightly from the base portion to the top surface of the stem portion, as disclosed in U.S. Pat. No. 6,940,178, which is incorporated herein by reference. The diameters of the stem portions 38, 44 at the upper surfaces 40, 46 can be made the same as or slightly smaller than the width of the traces in the circuitry layer 30 contacting the stem portions. Advantageously, the traces need not be enlarged or flared to capture the upper surfaces 40, 46 of the stem portions 38, 44, as compared to known embedded chip packages where the traces are flared to capture the upper surfaces of the vertical interconnects. Consequently, the circuitry layer 30 can have a greater density of traces than known embedded chip packages.

The stud bumps 32, 34 can be made of any suitable metal, such as, for example, nickel, copper, gold, alloys thereof, or a solder. In some embodiments, the stem portion can be made of a material that is softer than that of the base portion (as disclosed in U.S. Pat. No. 6,940,178) to promote bonding of the stem portion with a pad brought in contact with the stem portion.

A significant advantage of employing stud bumps 32, 34 for die-level and substrate-level interconnections is that a relatively fine pitch can be achieved. In particular embodiments, the pitch of stud bumps 34 can be about 80 microns or less, and more desirably about 60 microns or less. The pitch of stud bumps 32 in particular embodiments can be about 50 microns or less, and more desirably about 30 microns or less. The pitch of stud bumps enables extreme miniaturization of the overall package size. In particular embodiments, for example, the package can have a horizontal footprint (i.e., a footprint in an x-y plane parallel to the surfaces 16, 18 of the substrate) that is no greater than the horizontal footprint of the die plus about 0.5 mm in the x and y directions, and a height or thickness $h_1$ (FIG. 1) in the z-direction (excluding the substrate) that is no greater than the height or thickness $h_2$ of the die plus about 0.09 mm.

The package 10 can be formed as follows. First, the die 12 is attached to the first major surface 16 of the substrate 14 in a face-up orientation with the circuit side 22 of the die facing away from the substrate, as in a conventional wire bond package. The stud bumps 32, 34 are then formed on the die circuit side 22 and on the first major surface 16 of the substrate around the periphery of the die. The dielectric layer 28 is formed over the stud bumps 32, 34 and the die 12 using conventional techniques, such as by lamination, printing, or spin-on methods. The dielectric layer 28 and the stem portions 38, 44 of the stud bumps 32, 34 can then be planarized. Planarizing can be performed by using conventional chemical mechanical polishing techniques and/or a mechanical planarization apparatus, such as a grinder. Following the planarization step, the circuitry layer 30 can be formed over the dielectric layer 28 using conventional lithography.

A stud bump 32, 34 can conveniently be formed by an adaptation of a wire bonding process using a wire bonding tool. Particularly, a wire bonding tool configured for forming a wire bond (e.g., a gold or gold alloy wire bond) having a specified wire diameter is employed to form a roughly spherical (globular) wire end, which is contacted with the surface of a conductive contact site of the substrate or die under conditions of force and temperature that promote bonding of the globular wire end onto the conductive line surface, and resulting in some degree of flattening of the globular wire end. This somewhat flattened globular wire end comprises a base portion 36, 42 of the bump. Thereafter, the wire bonding tool is pulled away at a specified rate to form a tail, as described for example in U.S. Pat. No. 5,874,780, which is incorporated herein by reference. Then the tail is trimmed, resulting in a stem portion 38, 44 of the bump.

Figure 3:
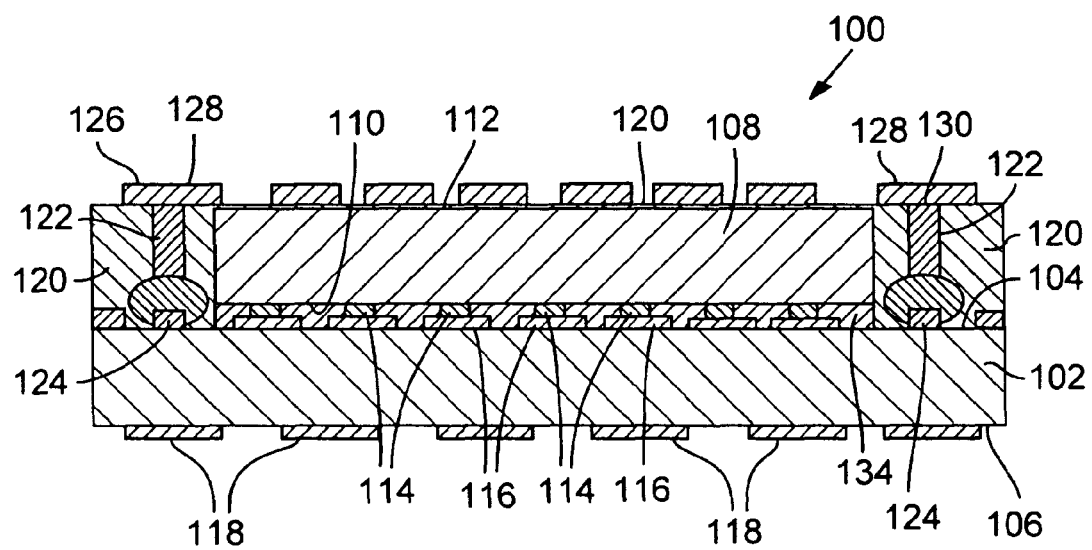
FIG. 3 is a schematic sectional view of a semiconductor package including a die mounted in a face-down, or flip chip, orientation, according to another embodiment.

FIG. 3 shows an exemplary embodiment of another semiconductor package, indicated at 100. The package 100 is similar in construction to the package 10 of FIG. 1, although the package 100 has a flip-chip configuration. The package 100 in the illustrated embodiment includes a substrate 102 having opposed, first and second major surfaces 104, 106, respectively, and a die 108 mounted face-down on the first major surface 104 of the substrate 102. The die 108 has a circuit side 110 facing the substrate 102 and a back side 112 facing away from the substrate 102.

The die 108 can be mounted to the substrate 102 in a conventional manner. For example, the interconnection of the circuitry in the die 108 can be made by way of bumps 114, which are bonded to an array of interconnect pads (not shown) on the die circuit side 110 and to an array of interconnect pads 116 on the substrate 102. A layer 134 of epoxy can be formed between the die and the substrate. The second major surface 106 of the substrate 102 can include a plurality of contacts, or pads, 118. Respective solder balls (not shown) can be reflowed on the pads 118 using conventional techniques to provide interconnection to the circuitry of, for example, one or more dies, a motherboard, or any of various other active or passive components.

The package 100 desirably includes a plurality of stud bumps 122, which can be formed in the same manner as stud bumps 34 shown in FIG. 1. As shown in FIG. 3, the stud bumps 122 can be spaced around the periphery of the die 108 and can be bonded to an array of interconnect pads 124 on the substrate 102. An encapsulating layer 120, preferably made of a dielectric material, is formed over the first major surface 104 of the substrate 102 so as to at least partially encapsulate the die 108 and the stud bumps 122. As shown in FIG. 3, in the illustrated embodiment, the encapsulating layer 120 completely covers the die 108 and the stud bumps 122 except for the upper surfaces of the stud bumps.

A patterned metal layer forming a circuitry layer 126 can be formed on top of the encapsulating layer 120. The circuitry layer 126 includes metal traces, such as traces 128, that contact the upper surfaces 130 of stud bumps 122. In this manner, the stud bumps 122 function to electrically connect the interconnect pads 124 on the first major surface 104 of the substrate 102 to one or more components (not shown) mounted on the circuitry layer 126. One or more dies and/or any of various other active or passive components can be mounted on the circuitry layer 126, thereby allowing for integration of the package in either direction along the z-axis.

The package 100 can be formed by mounting the die 108 to the substrate 102 using conventional techniques and then selectively forming the stud bumps 122 on pads 124 on the substrate in the manner described above. Thereafter, the encapsulating layer 120 can be formed over the stud bumps 122 and the die using conventional techniques. The upper surfaces of the stud bumps 122 and the encapsulating layer can then be planarized using known techniques as described above, after which the circuitry layer 126 can be formed over the planarized stud bumps and encapsulating layer.

Figure 4:
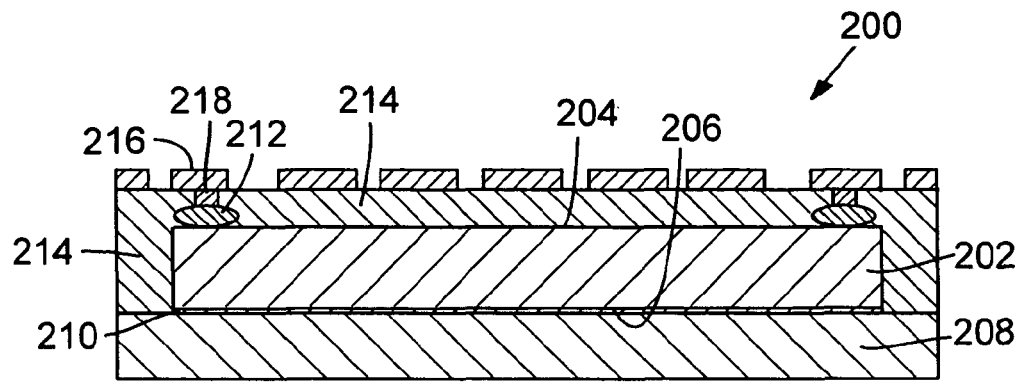
FIG. 4 is a schematic sectional view of a semiconductor package comprising a die mounted on a removable substrate, according to another embodiment.

FIG. 4 illustrates a semiconductor package 200, according to another embodiment. The package 200 includes a die 202 having a circuit side 204 and a back side 206. The die 202 is mounted face-up with respect to a support layer 208; that is, the back side 206 of the die is attached to the support layer 208, such as by a suitable adhesive layer 210. In particular embodiments, the support layer 208 comprises a removable substrate 208 that supports the components of the package as it is formed. The removable substrate 208 can be made of any of various suitable materials, including, without limitation, a polished silicon wafer, metal (e.g., stainless steel, nickel, or copper), glass, or any of various suitable polymers (e.g., Teflon or an adhesive material, such as epoxy).

Stud bumps 212 can be formed on respective interconnect pads (not shown) on the die circuit side 204. An encapsulating layer 214 can be formed over the die 202 and the stud bumps 212. The stud bumps 212 and the encapsulating layer 214 can be planarized, as previously described. A patterned metal layer 216 can be formed over the encapsulating layer 214 and can have traces contacting the upper surfaces 218 of the stud bumps 212 and the interconnect pads of any components (not shown) mounted on the metal layer 216. As shown in FIG. 4, the support layer 208 can have a footprint that extends beyond the edges of the die 202 (in the x and/or y directions) to support portions of the circuitry layer 216 that extend beyond the edges of the die 202. In alternative embodiments, the support layer 208 and the circuitry layer 216 can have a footprint in the x and y directions that is approximately equal to the footprint of the die 202.

After the metal layer 216 is formed, the substrate 208 can be removed, such as by etching away the substrate or peeling it off of the die 202. In a specific example, the removable substrate 208 can be made of a heat sensitive adhesive that can be peeled or otherwise removed from the die by applying heat to the substrate. If the substrate 208 is peeled off or otherwise removed intact, it can be re-used to form another semiconductor package. In other applications, the substrate 208 is not removed and instead is retained as part of the finished package 200.

Figure 5:
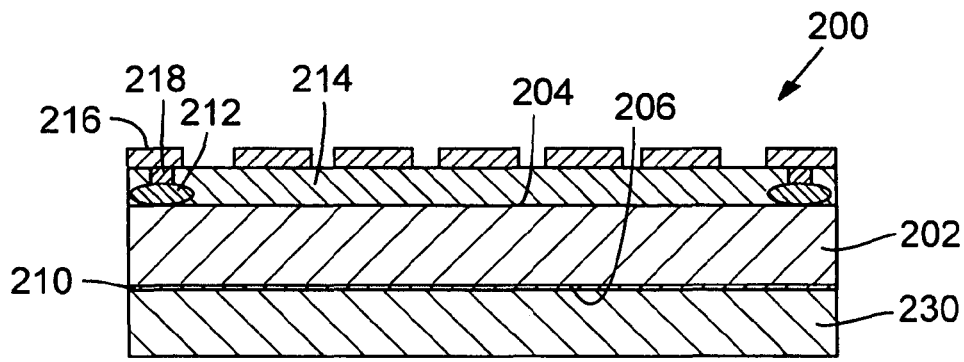
FIG. 5 is a schematic sectional view of a semiconductor package comprising a die mounted on a heat spreader, according to yet another embodiment.

In another embodiment, as shown in FIG. 5, the semiconductor package 200 can include a heat spreader, or heat sink, 230 rather than a removable substrate attached to the back side 206 of the die 202. The heat spreader 230 absorbs heat generated by the die 202 and dissipates the heat to atmosphere or the motherboard on which the package is mounted. The heat spreader 230 can comprise any of various suitable materials exhibiting good thermal conductivity, such as, for example, silicon, metals (e.g., aluminum, copper, nickel-plated copper, copper/tungsten). The heat spreader 230 in exemplary embodiments can comprise laminated layers of different metals, such as two layers of copper sandwiching an intermediate layer of invar or molybdenum. The adhesive layer 210 can comprise a thermally conductive material to facilitate heat transfer from the die to the heat spreader 230.

Figure 6:
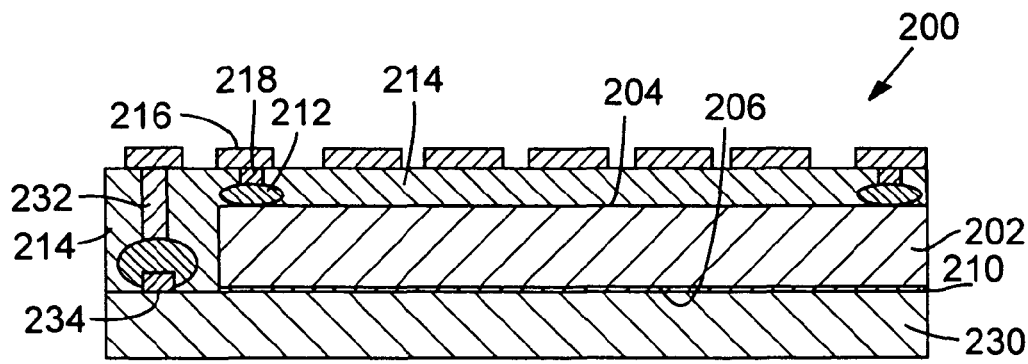
FIG. 6 is a schematic sectional view of a semiconductor package similar to FIG. 5, but having at least one stud bump formed on the heat spreader for electrically connecting the heat spreader to a source of ground reference voltage.

In particular embodiments, the heat spreader 230 also can be coupled to a source (not shown) of ground reference voltage, to thereby allow the heat spreader to function as a ground reference plane. For example, as shown in FIG. 6, the heat spreader 230 can be electrically connected to a source of ground reference voltage via at least one stud bump 232 disposed on the heat spreader. As shown, one side of the heat spreader can be extended past the edge of the die to accommodate the stud bump 232. The stud bump 232 can be formed on a contact 234 on the heat spreader 230 and then encapsulated by layer 214. The upper surface of the stud bump 232 can be planarized along with stud bumps 212 prior to forming metal layer 216 over the stud bumps 212, 232.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. I therefore claim as my invention all that comes within the scope and spirit of these claims.

What is claimed:

1. A method of making a semiconductor device, comprising:
   providing a semiconductor die;
   forming a conductive layer in a peripheral region around the semiconductor die; and
   forming a first stud bump over the conductive layer by pressing a wire over the conductive layer under temperature to flatten an end of the wire and form an enlarged base portion covering a top surface and side surface of the conductive layer.

2. The method of claim 1, further including depositing an encapsulant over the semiconductor die and first stud bump.

3. The method of claim 2, further including forming a conductive trace over the encapsulant and electrically connected to the first stud bump.

4. The method of claim 2, wherein the semiconductor die includes an active surface, a back surface opposite the active surface, and a side surface disposed between the active surface and the back surface with the side surface of the semiconductor die exposed from the encapsulant.

5. The method of claim 1, further including forming a second stud bump over the semiconductor die.

6. The method of claim 1, further including:
   providing a substrate; and
   disposing the semiconductor die over the substrate.

7. A method of making a semiconductor device, comprising:
   providing a semiconductor die;
   forming a conductive layer in a peripheral region around the semiconductor die;
   forming a first stud bump over the conductive layer to include an enlarged base portion covering a side surface of the conductive layer and a stem portion extending from the enlarged base portion using a wire bonding tool; and
   depositing an encapsulant over the semiconductor die and first stud bump.

8. The method of claim 7, further including forming a second stud bump over the semiconductor die.

9. The method of claim 7, further including planarizing the encapsulant and the stem portion of the first stud bump.

10. The method of claim 7, further including:
    providing a substrate; and
    disposing the semiconductor die over the substrate.

11. The method of claim 7, wherein forming the first stud bump includes:
    providing a bond wire;
    rounding an end of the bond wire to form the enlarged base portion; and
    trimming the bond wire to form the stem portion.

12. The method of claim 7, wherein a side surface of the semiconductor die is exposed from the encapsulant.

13. The method of claim 7, further including forming a conductive trace over the encapsulant and electrically connected to the first stud bump.

14. A semiconductor device, comprising:
    a semiconductor die;
    a first conductive layer formed in a peripheral region around the semiconductor die; and
    a first stud bump formed over the first conductive layer, the first stud bump including an enlarged base portion to cover a top surface and side surface of the first conductive layer and a stem portion extending from the enlarged base portion, wherein the stem portion includes a truncated cone shape.

15. The semiconductor device of claim 14, further including an encapsulant deposited over the semiconductor die and first stud bump.

16. The semiconductor device of claim 15, further including a second conductive layer formed over the encapsulant.

17. The semiconductor device of claim 14, further including a second stud bump formed over the semiconductor die.

18. The semiconductor device of claim 14, further including a substrate, wherein the semiconductor die is disposed over the substrate.

19. A semiconductor device, comprising:
    a semiconductor die including an active surface, a back surface opposite the active surface and a side surface disposed between the active surface and the back surface;
    a first conductive layer formed in a peripheral region around the semiconductor die;
    a first stud bump formed over the first conductive layer, the first stud bump including a base width greater than a width of the first conductive layer; and
    an encapsulant deposited over the semiconductor die and first stud bump, wherein the side surface of the semiconductor die is exposed from the encapsulant.

20. The semiconductor device of claim 19, further including a second stud bump formed over the semiconductor die.

21. A semiconductor device, comprising:
- a semiconductor die;
- a first conductive layer formed in a peripheral region around the semiconductor die;
- a first stud bump formed over the first conductive layer, the first stud bump including an enlarged base portion to cover a side surface of the first conductive layer and a stem portion extending from the enlarged base portion; and
- an encapsulant deposited over the semiconductor die and first stud bump.

22. The semiconductor device of claim 21, further including a second conductive layer formed over the encapsulant and electrically connected to the first stud bump.

23. The semiconductor device of claim 21, further including a second stud bump formed over the semiconductor die.

24. The semiconductor device of claim 21, wherein the encapsulant is planarized with the stem portion of the first stud bump.

25. The semiconductor device of claim 21, wherein the first stud bump includes a bond wire with a rounded end to form the enlarged base portion.

26. The semiconductor device of claim 21, further including a substrate, wherein the semiconductor die is disposed over the substrate.

* * * * *